United States Patent [19]

Shen et al.

[11] Patent Number: 5,477,169

[45] Date of Patent: Dec. 19, 1995

[54] LOGIC CIRCUIT WITH NEGATIVE DIFFERENTIAL RESISTANCE DEVICE

[75] Inventors: Jun Shen, Phoenix; Herbert Goronkin, Tempe; Saied N. Tehrani, Scottsdale, all of Ariz.

[73] Assignee: Motorola, Schaumburg, Ill.

[21] Appl. No.: 261,799

[22] Filed: Jun. 20, 1994

[51] Int. Cl.⁶ .............................. G06F 7/50; H03K 19/21
[52] U.S. Cl. .............................................. 326/55; 326/55
[58] Field of Search .................................. 326/52, 54, 55, 326/132, 134; 257/25, 194

[56] References Cited

U.S. PATENT DOCUMENTS

| | | | |
|---|---|---|---|
| 3,235,754 | 2/1966 | Buelow et al. | 307/88.5 |
| 3,558,913 | 1/1971 | Hatley | 307/206 |
| 4,021,680 | 5/1977 | Kataoka et al. | 307/216 |
| 4,207,476 | 6/1980 | Upadhyayula | 307/216 |
| 4,242,595 | 12/1980 | Lehovec | 307/205 |
| 5,336,949 | 8/1994 | Mimura | 307/448 |

*Primary Examiner*—Edward P. Westin
*Assistant Examiner*—Stephen Calogero
*Attorney, Agent, or Firm*—Eugene A. Parsons

[57] ABSTRACT

A logic circuit including a pair of FETs connected in parallel and including first and second common current terminals, each of the FETs further having a control terminal connected to receive a logic signal thereon. A negative differential resistance device affixed to one of the first and second common current terminals and having a conductance characteristic such that the device operates at a peak current when one of the FETs is turned ON and at a valley current when both of the FETs are simultaneously turned ON. A load resistance coupled to the other of the first and second common current terminals and providing an output for the logic circuit.

18 Claims, 3 Drawing Sheets

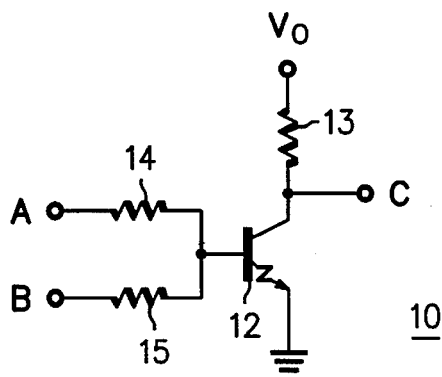
FIG. 1
*- PRIOR ART -*
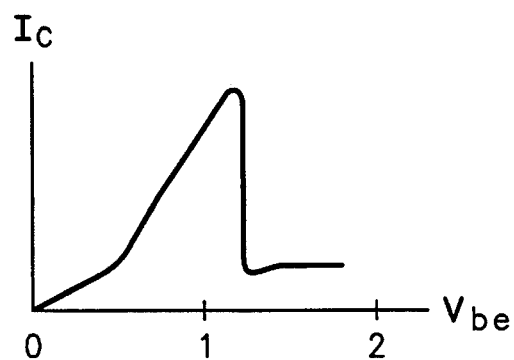
FIG. 2
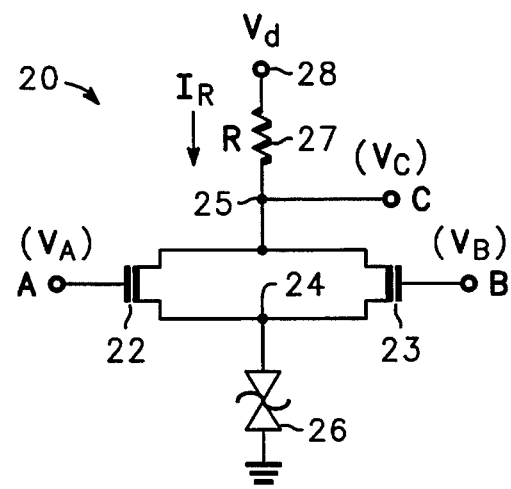
FIG. 3   FIG. 4
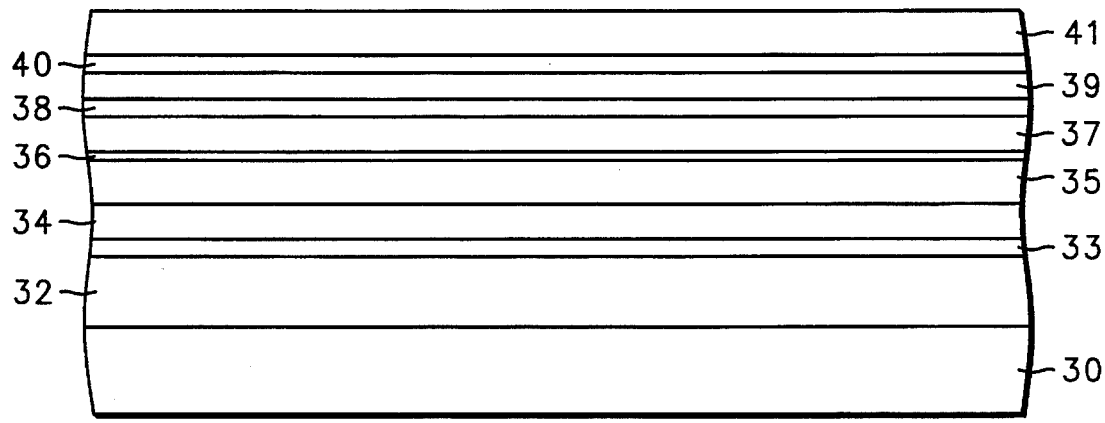
FIG. 5

LOGIC CIRCUIT WITH NEGATIVE DIFFERENTIAL RESISTANCE DEVICE

FIELD OF THE INVENTION

The present invention pertains to logic circuits and more specifically to logic circuits including a plurality of elements and formed as a single device.

BACKGROUND OF THE INVENTION

Logic circuits and their uses are well known in the art. Generally, a specific logic circuit includes a plurality of elements or components, such as transistors, diodes, resistors and the like. Also, it is generally quite difficult to integrate these various components onto a single semiconductor chip because of different requirements, etc. Also, resistors are difficult to accurately fabricate on a semiconductor chip and generally require relatively large amounts of chip surface.

Thus, there is a need to provide simplified logic circuits, which can be formed as a single unit.

It is a purpose of the present invention to provide a new and improved logic circuit which can be fabricated in a single unit.

It is another purpose of the present invention to provide a new and improved logic circuit which utilizes few, if any, resistors.

It is still another purpose of the present invention to provide a new and improved logic circuit which can be combined with existing technologies to provide high performance and smaller dies for logic circuits.

SUMMARY OF THE INVENTION

The above problems and others are substantially solved and the above purposes and others are realized in a logic circuit including a pair Of field effect transistors connected in parallel and including first and second common current terminals, each of the pair of field effect transistors further having a control terminal connected to receive a logic signal thereon. The logic circuit further includes a negative differential resistance device operably affixed to one of the first and second common current terminals of the pair of field effect transistors and having a conductance characteristic such that the negative differential resistance device operates approximately at a peak current when one of the pair of field effect transistors is turned ON and approximately at a valley current when both of the pair of field effect transistors are simultaneously turned ON. A load resistance is coupled to the other of the first and second common current terminals and provides an output for the logic circuit.

The above logic circuit can be fabricated with the negative differential resistance device connected between the first common current terminal and a terminal constructed to have applied thereto a supply potential to perform an exclusive OR function. The above logic circuit can alternatively be fabricated with the negative differential resistance device connected between the second common current terminal and a terminal constructed to have applied thereto a reference potential to perform an exclusive NOR function.

The above problems and others are substantially solved and the above purposes and others are further realized in one method of fabricating a logic circuit including the steps of providing a substrate with a relatively planar surface, forming a plurality of layers including a buffer layer on the planar surface of the substrate, a channel layer on the buffer layer, a supply layer on the channel layer, a conductive layer on the supply layer, an etch stop layer on the conductive layer, a first resonant tunneling layer on the etch stop layer, a first barrier layer on the resonant tunneling layer, a quantum well layer on the first barrier layer, a second barrier layer on the quantum well layer, and a second resonant tunneling layer on the second barrier layer. An ohmic metal contact is formed on the second resonant tunneling layer defining a first contact of a negative differential resistance device and a step of selectively etching the second resonant tunneling layer, the second barrier layer, the quantum well layer, the first barrier layer and the first resonant tunneling layer to the etch stop layer, using a first etchant and the ohmic metal contact as a mask is performed. A step of selectively etching the etch stop layer to the conductive layer using a second etchant and the ohmic metal contact as a mask is performed to complete a second contact of the negative differential resistance device, the second contact defining a first common current terminal area. A pair of ohmic metal contacts are formed on the conductive layer in spaced relationship to the defined first common current terminal area. A step of defining a pair of gate contact areas, one each positioned between each of the pair of spaced apart ohmic metal contacts and the defined first common current terminal area and selectively removing the conductive layer in the pair of gate contact areas to expose a pair of surface areas of the; supply layer is performed and Schottky metal contacts are formed on the pair of exposed surface areas of the supply layer in the gate contact area.

BRIEF DESCRIPTION OF THE DRAWINGS

Referring to the drawings wherein like characters indicate like parts throughout the various figures:

FIG. 1 is a schematic representation of a prior art exclusive NOR logic circuit;

FIG. 2 is a graphic representation of the current-voltage characteristic of the active component in the logic circuit of FIG. 1;

FIG. 3 illustrates an exclusive NOR truth table;

FIG. 4 is a schematic representation of an embodiment of a logic circuit in accordance with the present invention;

FIGS. 5 and 6 are simplified cross-sectional views of different structures or steps in the fabrication of the logic circuit of FIG. 4;

DESCRIPTION OF THE PREFERRED EMBODIMENTS

Figure 6:
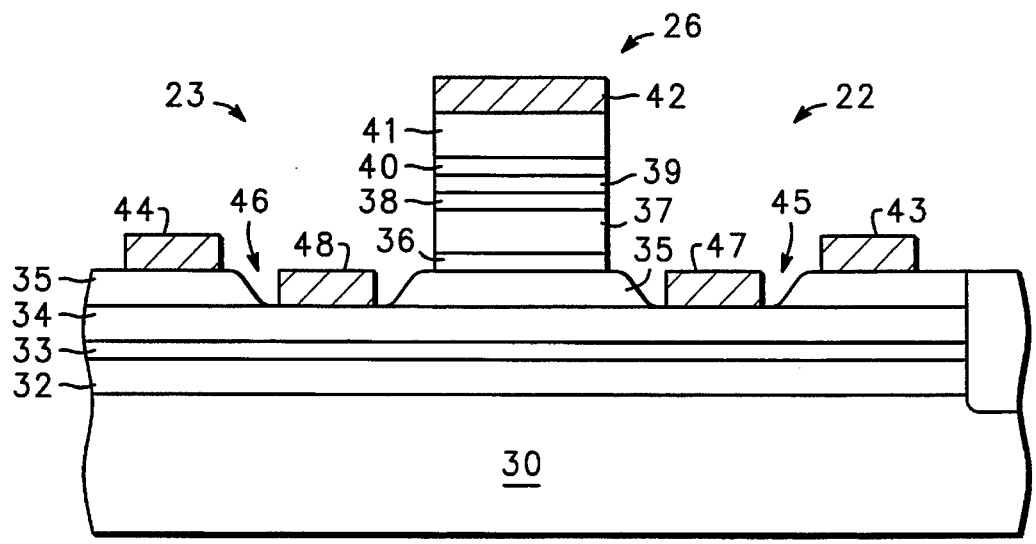

Logic devices based on resonant tunneling diodes (RTD) and resonant tunneling transistors (RTT) are presently being studied as future multi-functional elements in electronic circuits. Most of the devices presently being proposed. utilize the gate (or base) of the RTT as the input node. By increasing the gate voltage, the resonance levels in the quantum well are tuned in or out of resonance with the Fermi level of the injected carriers. Thus, a non-monotonic output dependence on the input is achieved and so is the multi-functionality.

One recently proposed exclusive OR (XOR) or exclusive NOR (XNOR) device utilizes an "RTT" with a working principle that can actually be separated into two parts: an RTD and a regular bipolar transistor connected in series. The bipolar transistor acts as a variable resistor (with current saturation). For a fixed $V_{ce}$ (beyond the RTD peak voltage) in a common emitter configuration, changing $V_{be}$ alters the relative amount of voltage drop across the bipolar transistor and changes the current $I_c$. Assuming the bipolar transistor is off ($I_c=0$) at zero $V_{be}$, an initial positive $V_{be}$ gradually turns on the bipolar transistor and increases $I_c$. When $V_{be}$ turns on harder and $I_c$ increases further and passes the peak current of the RTD, $I_c$ drops sharply and gives rise to the wanted negative transconductance.

Referring specifically to FIG. 1, a schematic representation of a prior art XNOR logic circuit 10 is illustrated. Logic circuit 10 includes an RTT 12 having an emitter connected to ground, a gate or base and a collector. The collector is connected through a load resistor 13 to a suitable source of power $V_o$ and, also, directly to an output terminal C. The gate is connected through two equal resistors 14 and 15 to two inputs A and B, respectively. The $V_{be}$-$I_c$ curve for RTT 12 is illustrated in FIG. 2. As illustrated in FIG. 2, when a logic high is connected to one of inputs A or B, $I_c$ is at the peak (number 1). When both inputs A and B have a logic high thereon, $I_c$ is in the valley beyond the peak (number 2). Thus, an XNOR function is achieved in logic circuit 10 of FIG. 1, as illustrated by the truth table illustrated in FIG. 3.

The major problems with logic circuit 10 are the fact that resistors 14 and 15 are difficult to fabricate in an integrated circuit. Resistors 14 and 15 generally require a relatively large amount of substrate surface area and are difficult to fabricate and match. Also, logic circuit 10 requires relatively high amounts of current.

Referring to FIG. 4, a schematic diagram of an XOR/XNOR logic circuit 20 in accordance with the present invention is illustrated. Logic circuit 20 includes a pair of FETs 22 and 23, which in this specific embodiment are enhancement FETs. FETs 22 and 23 are connected in parallel, each with a source connected to a first common current terminal 24 and a drain connected to a second common current terminal 25. In the XNOR configuration illustrated in FIG. 4, first common current terminal 24 is connected to one terminal of an RTD 26, the other terminal of which is connected to a reference potential, which in this embodiment is ground. As will be explained presently, FETs 22 and 23 and RTD 26 are fabricated as a single unit or device.

In the XNOR configuration illustrated in FIG. 4, second common current terminal 25 is connected through a load resistor 27 to a terminal 28, adapted to have a potential source $V_d$ attached thereto. While load resistor 27 is illustrated schematically as a resistor, it should be understood that any convenient resistive load can be utilized as, for example, a transistor monolithically fabricated with the other devices. Second common current terminal 25 is also connected directly to an output terminal C. FETs 22 and 23 each have a gate attached directly to logic inputs designated A and B, respectively.

In the operation of logic circuit 20, when both $V_A$ and $V_B$ are low (low logic levels applied thereto), little current is flowing through load resistor 27 so that $V_C$ is high. When either $V_A$ or $V_B$ is a logic high (turned ON), $I_R$ is large and, thus, $V_C$ is low. Here it should be noted that the operating point of logic circuit 20 is set so that $I_R$, when one of FETs 22 and 23 is turned ON, does not exceed the peak current of RTD 26. When both $V_A$ and $V_B$ are a logic high, $I_R$ exceeds the peak current of RTD 26 and switches RTD 26 to its valley, making $V_C$ high. In the latter instance, a relatively larger voltage drops across RTD 26, which has a tendency to further turn OFF FETs 22 and 23. Thus, an XNOR function is achieved in logic circuit 20 of FIG. 4, as illustrated by the truth table illustrated in FIG. 3.

To alter the function of logic circuit 20 to an XOR function, RTD 26 is connected between common current terminal 25 and potential terminal 28 and load resistor 27 and output terminal C are connected between common current terminal 24 and the reference potential. Generally, this alteration can be achieved by simply reversing the potential on terminal 28 and the reference potential. Thus, when either $V_A$ Or $V_B$ is a logic high (turned ON), $I_R$ is large and, thus, $V_C$ is high. When both $V_A$ and $V_B$ are a logic high, $I_R$ exceeds the peak current of RTD 26 and switches RTD 26 to its valley, making $V_C$ low. Thus, RTD 26 forms a negative differential resistance component which provides the switching action for logic circuit 20.

One method of fabricating the device (FETs 22 and 23 and RTD 26) is illustrated in FIGS. 5 and 6. Referring specifically to FIG. 5, a simplified cross-sectional view of a substrate 30 having a heterostructure of layers of material grown on a planar surface thereof is illustrated. While specific materials in a specific material system and specific layer thicknesses are utilized herein for example, it will be understood that some changes may be made without effecting the purpose herein described.

Substrate 30 is formed of semi-insulating gallium arsenide (GaAs). A buffer layer 32 of gallium arsenide (GaAs) is epitaxially grown on the planar surface thereof to reduce crystal stress in subsequent layers. A channel layer 33 of indium gallium arsenide (InGaAs) is epitaxially grown on the surface of buffer layer 32. A supply layer 34 of aluminum gallium arsenide (AlGaAs) is grown on the surface of channel layer 33. A relatively heavily doped contact layer 35 of GaAs is grown on the surface of supply layer 34. Layer 35 is doped, for example, with silicon ions or the like to a density of approximately $2 \times 10^{18}$ cm$^{-3}$ to provide relatively good conductivity, for reasons that will become apparent presently.

At this point several different methods of fabrication may be utilized, depending primarily on the sequence of the following steps. Thus, a first method of fabrication will be described with some possible variations in the sequence of steps explained later.

An etch stop layer 36 of gallium antimonide (GaSb) is grown on the surface of contact layer 35. A first resonant tunneling, or transition, layer 37 of indium arsenide (InAs) is grown on the surface of etch stop layer 36. A first relatively thin (approximately 15–25 angstroms) barrier layer 38 of AlSb is epitaxially grown on the surface of InAs resonant tunneling layer 37, followed by a quantum well layer 39 of GaSb (less than 100 angstroms thick and preferably approximately 65 angstroms), and, in turn, followed by a second relatively thin barrier layer 40 of AlSb. A second relatively heavily doped layer 41 of InAs is epitaxially grown on barrier layer 40 as a final layer.

The structure of FIG. 5 is formed into FETs 22 and 23 and RTD 26, illustrated schematically in FIG. 4, in a first fabrication method by etching and properly applying external contacts as follows. A first ohmic contact 42 is formed with final InAs layer 41, which contact serves as one terminal for RTD 26. Using contact 42 as a mask, the upper layers, layers 41, 40, 39, 38 and 37 are etched down to etch stop layer 36. In a typical example, layer 41 is etched with a first solution of $CH_3COOH:H_2O_2:H_2O$ in a ratio of approximately 5:1:5. Then layers 40, 39 and 38 are etched with a second solution of $NH_4OH:H_2O$ in a ratio of approximately 10:1, after which layer 37 is etched down to etch stop layer 36 by again using the first solution. Etch stop layer 36 is then removed down to contact layer 35 using the second solution. The etched mesa formed by ohmic contact 42 and layers 41, 40, 39, 38 and 37, illustrated in FIG. 6, form RTD 26.

As is also illustrated in FIG. 6, a second pair of ohmic contacts 43 and 44 are formed with heavily doped GaAs contact layer 35, in spaced relationship to RTD 26, by some convenient method. Ohmic contact 43 forms the drain, or in the alternative, the source, of FET 22 and ohmic contact 44 forms the drain, or in the alternative, the source, of FET 23. All of the contacts 42, 43 and 44 are formed of some convenient metal system, such as nickel-gold-germanium (NiAuGe) which is applied by any convenient method, such as evaporation and lift-off. Gate contact areas 45 and 46, for FETs 22 and 23, respectively, are defined between contact 43 and RTD 26 and between contact 44 and RTD 26, respectively, using some convenient method such as mask and photoresist. Heavily doped GaAs contact layer 35 is removed by etching or the like in gate contact areas 45 and 46 and Schottky metal contacts 47 and 48 are formed on the exposed upper surface of supply layer 34 in gate contact areas 45 and 46, respectively.

To complete the structure of FIG. 6, a reference potential (in this embodiment, ground) is connected to contact 42. Also, contacts 43 and 44 are connected together and connected through a load resistor, which may be formed somewhere else on the substrate or supplied externally, to supply potential $V_d$. A terminal C is also connected to contact 42 and terminals A and B are connected to gate contacts 47 and 48, respectively. In instances where a plurality of logic circuits are formed on a single substrate, these connections (terminals) are generally formed with the metallization steps.

Figure 7:
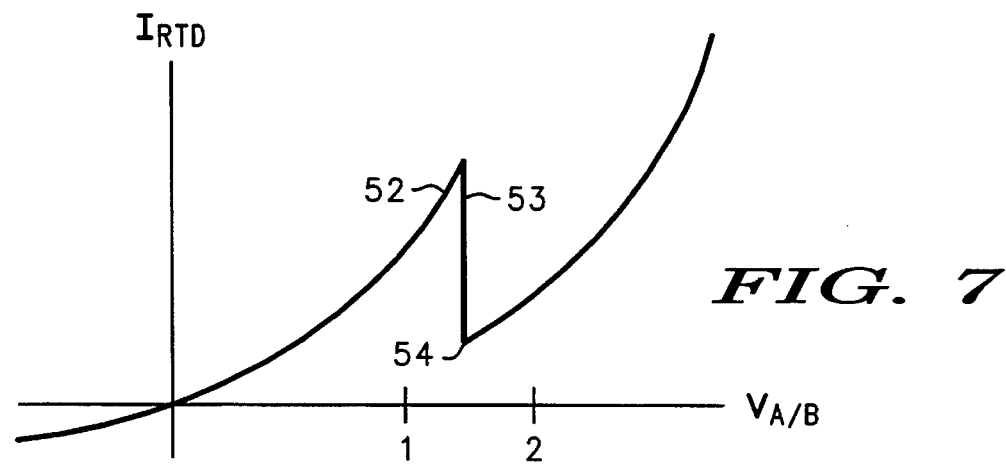
FIG. 7 is a graphic representation of the current-voltage characteristic of a negative differential resistance component in the logic circuit of FIG. 6.

Referring specifically to FIG. 7, a composite graph for logic circuit 20 (FETs 22 and 23 and RTD 26) is illustrated. The composite graph depicts current flowing in logic circuit 20 ($I_{RTD}$) versus voltages applied to inputs A and B ($V_{A/B}$). In RTD 26 (see FIG. 6), the relatively narrow bandgap of InAs layer 41 is separated from the bandgap of GaSb quantum well layer 39 by the relatively large bandgap of barrier layer 40. Further, the bandgap of GaSb quantum well layer 39 is separated from the bandgap of InAs resonant tunneling layer 37 by the relatively large bandgap of barrier layer 38. Generally, barrier layers 38 and 40 have a relatively large bandgap to provide a barrier for the free flow of carriers thereacross but are formed very thin so that carriers can tunnel relatively easily between aligned energy bands. In this specific embodiment, GaSb quantum well layer 39 is formed sufficiently wide to allow a ground state quantized level in its valence band to be above the conduction band of InAs.

When potential $V_d$ is applied between contacts 43/44 and contact 42 and either a logic high $V_A$ or $V_B$ is applied to contact A or B, the electrons in the InAs layer tunnel through the valence band energy states in GaSb layer 39. As this occurs, a peak 52 in current ($I_{RTD}$) occurs, generally as illustrated in FIG. 7. When additional potential $V_A$ and $V_B$ is applied, the electrons in the InAs layer are blocked by the band gap of GaSb layer 39 and IRTD suddenly drops off, as illustrated at 53 in FIG. 4, to a valley 54. Thus, RTD 26 forms a negative differential resistance component in logic circuit 20. In the present embodiment, relatively heavily doped InAs layers 41 and 37 are included to provide a low resistance access path for RTD 26.

In a somewhat different method of fabricating logic circuit 20, substrate 30 is provided and layers 32 through 35 are grown as described above. Ohmic metal contacts 43 and 44 are formed as described above and Schottky contacts 47 and 48 are formed as described above in whatever sequence is most convenient for the specific methods being utilized. An RTD space is then defined, by masking and photoresist for example, and layers 37 through 41 are selectively grown on the defined space to form RTD 26. Since the layers are not etched, as in the embodiment described above, an etch stop layer is not required. Ohmic metal contact 42 is formed on layer 41, as previously described, to complete RTD 26 and FETs 22 and 23.

In some applications, it is convenient to utilize a silicon substrate and to fabricate a structure similar to that of FIG. 6 in silicon. In such applications an Esaki diode is fabricated to replace RTD 26 of FIG. 6 and silicon-based MOSFETs, or the like, are formed on either side to replace FETs 22 and 23 of FIG. 6. In this structure, the Esaki diode, which is a $p^+$–$n^+$ junction tunneling diode, is the negative differential resistance device which allows the circuit to operate as a logic circuit. As in FIG. 6, the Esaki diode is formed on the common source/drain of the MOSFETs. This circuit has the advantage of being easy to integrate into silicon-based circuits.

Figure 8:
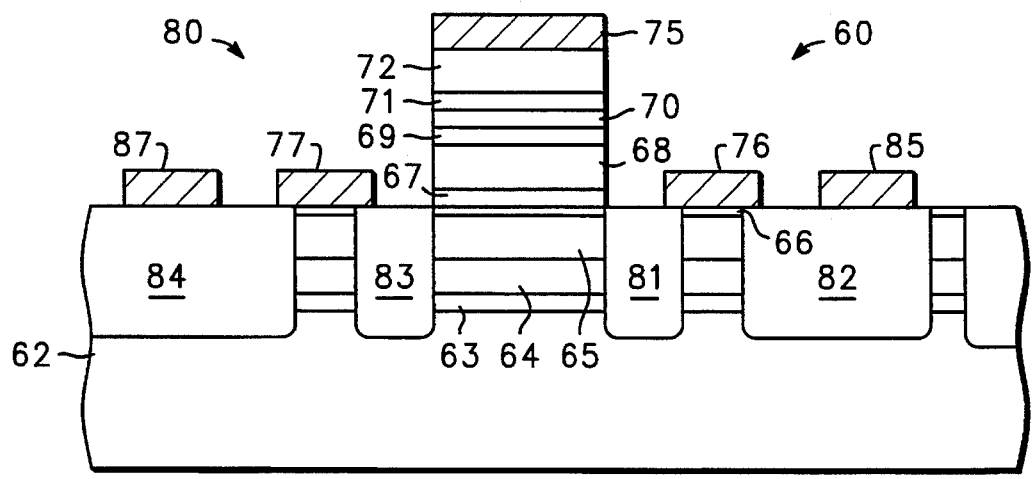
FIG. 8 is a simplified cross-sectional view of another embodiment of a logic circuit in accordance with the present invention.

Referring to FIG. 8, a simplified cross-sectional view of another embodiment of logic circuit 20 is illustrated. In the fabrication of a FET 60, a substrate 62 is provided having a substantially planar surface. In the specific example to be described, substrate 62 is GaAs and an InAs/GaSb/AlSb material system is utilized for its convenience. A plurality of layers are sequentially epitaxially grown on each other including a buffer layer 63 of GaAs grown on substrate 62, a channel layer 64 of InGaAs is epitaxially grown on the surface of buffer layer 63, a supply layer 65 of AlGaAs is grown on the surface of channel layer 64, and a heavily doped contact layer 66 is grown on the surface of supply layer 65. Again at this point a divergence of methods, or the sequence of various steps, may occur.

In a first continuing method, an etch stop layer 67 of GaSb is grown on the surface of contact layer 66, a resonant tunneling layer 68 of InAs is grown on etch stop layer 67, a first barrier layer 69 of AlSb is grown on resonant tunneling layer 68, a quantum well layer 70 is grown on first barrier layer 69, a second barrier layer 71 of AlSb is grown on quantum well layer 70 and a contact layer 72 of InAs is grown on second barrier layer 71. An ohmic contact 75 is formed on contact layer 72 and utilized as a mask to etch through layers 72 to 68 down to etch stop layer 67, as previously described. Etch stop layer 67 is then etched using ohmic contact 75 as a mask. Schottky metal gate contacts 76 and 77 are then formed for FETs 60 and 80. Gate contacts 76 and 77, along with some other masking method such as photoresist, is utilized to implant areas 81 and 82 in FET 60 and areas 83 and 84 in FET 80. FET 60 is completed by forming ohmic contact 85 and FET 80 is completed by forming ohmic contact 87.

In a slightly different sequence of steps, immediately subsequent to the growth of contact layer 66, Schottky metal gate contacts 76 and 77 are formed and implants 81, 82, 83 and 84 are made. Any necessary annealing steps can be performed at this time and the entire structure is covered with a mask layer (not shown), such as $Si_3N_4$. A window is then opened and layers 68 through 72 are selectively grown to form the RTD. Ohmic contact 75 is formed on top of layer 72 as previously described, to complete the RTD. Also, windows are opened to form ohmic contacts 85 and 87 in contact with implants 82 and 84, respectively.

Figure 9:
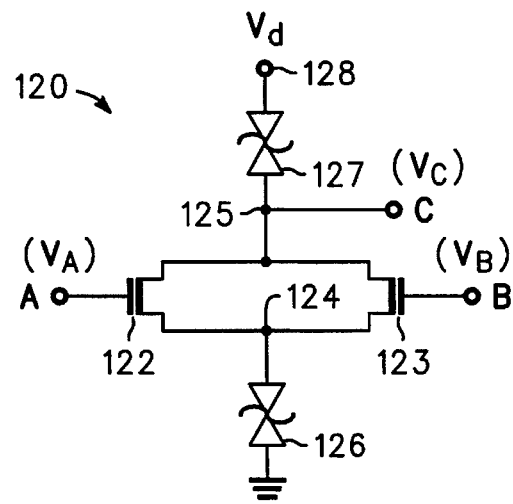
FIG. 9 is a schematic representation of another embodiment of a logic circuit in accordance with the present invention.

Referring to FIG. 9, a schematic diagram of another embodiment of an XOR/XNOR logic circuit 120 in accordance with the present invention is illustrated. Components similar to components of FIG. 4 are designated with a similar number and all numbers have a "1" prefix to indicate the different embodiment. Logic circuit 120 includes a pair of FETs 122 and 123 connected in parallel, each with a source connected to a first common current terminal 124 and a drain connected to a second common current terminal 125. A first common current terminal 124 is connected to one terminal of an RTD 126, the other terminal of which is connected to a reference potential, which in this embodiment is ground. In the XNOR configuration illustrated in FIG. 9, a second common current terminal 125 is connected through a second RTD 127 to a terminal 128, adapted to have a potential source $V_d$ attached thereto. Second common current terminal 125 is also connected directly to an output terminal C. FETs 122 and 123 each have a gate attached directly to logic inputs designated A and B, respectively. As will be explained presently, FETs 122 and 123 and RTDs 126 and 127 are fabricated as a single unit or device.

In the operation of logic circuit 120, RTD 127 is constructed to operate on a linear portion of the current/voltage characteristic curve (similar to the curve of FIG. 7) between zero and the peak (e.g. peak 52, or beyond the valley region) so that it basically operates in the same manner as a load resistor. This can be accomplished, for example, by fabricating RTD 127 with a much larger or smaller current carrying area, or diameter, than RTD 126. When both $V_A$ and $V_B$ are low (low logic levels applied thereto), little current is flowing through RTD 127 so that $V_C$ is high. When either $V_A$ or $V_B$ is a logic high (turned ON), $I_R$ is large and, thus, $V_C$ is low. As in logic circuit 20 of FIG. 4, the operating point of logic circuit 120 is set so that IR, when one of FETs 122 and 123 is turned ON, does not exceed the peak current of RTD 126. When both $V_A$ and $V_B$ are a logic high, $I_R$ exceeds the peak current of RTD 126 and switches RTD 126 to its valley, making $V_C$ high. In both of these instance, RTD 127 remains below the peak current so that no switching occurs. Thus, an XNOR function is achieved in logic circuit 120 of FIG. 9, as illustrated by the truth table illustrated in FIG. 3, wherein RTD 126 is a negative differential resistance component which provides the switching action.

Figure 10:
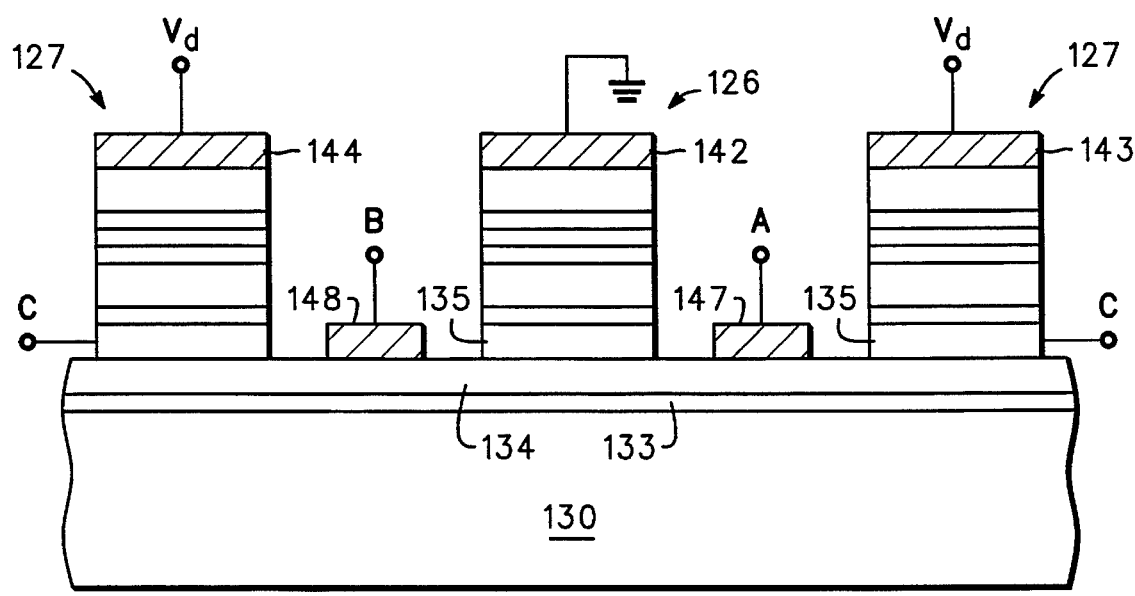
FIG. 10 is a simplified cross-sectional view of the logic circuit illustrated in FIG. 9.

Referring specifically to FIG. 10, a simplified cross-sectional view of one embodiment of logic circuit 120 is illustrated. A structure similar to that of FIG. 5 is formed into FETs 122 and 123 and RTDs 126 and 127, illustrated schematically in FIG. 9, in one specific fabrication method by etching and properly applying external contacts, generally as previously described. In this embodiment, three ohmic contacts 142, 143 and 144 are formed with a final InAs layer, which contacts serve as one terminal for RTDs 126 (ohmic contact 142) and 127 (ohmic contacts 143 and 144). Using contacts 142, 143 and 144 as a mask, the upper layers are etched down to contact layer 135, generally using the solutions and procedure previously explained. The etched mesas formed by ohmic contacts 142, 143 and 144 and the various epitaxial layers form RTDs 126 and 127.

Gate contact areas, for FETs 122 and 123, respectively, are defined between the mesas, using some convenient method such as mask and photoresist, if necessary. Heavily doped GaAs contact layer 135 is removed by etching or the like in the gate contact areas and Schottky metal gate contacts 147 and 148 are formed on the exposed upper surface of supply layer 134 in the gate contact areas. To complete the structure of FIG. 10, a reference potential (in this embodiment, ground) is connected to contact 142. Also, contacts 143 and 144 are connected together and connected to a supply potential $V_d$. A terminal C is also connected to contact layer 135 generally at the base of either of the outer mesas and terminals A and B are connected to gate contacts 147 and 148, respectively. As previously explained, in instances where a plurality of logic circuits are formed on a single substrate, these connections (terminals) are generally formed with the metallization steps.

Thus, the embodiment illustrated in FIGS. 9 and 10 is formed in a single operation and does not require the formation of even a load resistor. Because the entire circuit is fabricated in a single operation, this embodiment is extremely easy to integrate into complete integrated circuits or to integrate with existing VLSI or USLI technologies.

The new and improved logic circuits disclosed are substantially easier to fabricate, since all of the active components are fabricated and connected in a single process. Also, the new and improved logic circuits can be easily integrated with existing VLSI and ULSI technologies. Further, the new and improved logic circuits require substantially less space on a substrate and require less current during operation. Thus, the new and improved logic circuits are especially useful since they can be easily combined with existing technologies to provide high performance and smaller dies for logic circuits.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. A logic circuit comprising:

a pair of field effect transistors connected in parallel and including first and second common current terminals, each of the pair of field effect transistors further having a control terminal connected to receive a logic signal thereon;

a negative differential resistance device operably affixed to one of the first and second common current terminals of the pair of field effect transistors and having a conductance characteristic such that the negative differential resistance device operates approximately at a peak current when one of the pair of field effect transistors is turned ON and approximately at a valley current when both of the pair of field effect transistors are simultaneously turned ON; and a load resistance coupled to the other of the first and second common current terminals and providing an output for the logic circuit.

2. A logic circuit as claimed in claim 1 wherein the negative differential resistance device includes a resonant tunneling diode.

3. A logic circuit as claimed in claim 1 wherein the negative differential resistance device includes an Esaki diode.

4. A logic circuit as claimed in claim 1 wherein each of the pair of field effect transistors includes an enhancement mode heterostructure field effect transistor.

5. A logic circuit as claimed in claim 1 wherein the pair of field effect transistors and the negative differential resistance device are all formed as a unit on a common substrate.

6. A logic circuit as claimed in claim 1 wherein the negative differential resistance device is connected between the first common current terminal and a terminal constructed to have applied thereto a supply potential and the logic circuit performs an exclusive OR function.

7. A logic circuit as claimed in claim 1 wherein the negative differential resistance device is connected between the second common current terminal and a terminal constructed to have applied thereto a reference potential and the logic circuit performs an exclusive NOR function.

8. A logic circuit as claimed in claim 1 wherein the load resistance includes a heterostructure device constructed to operate as a resistance when one and both of the pair of field effect transistors are turned ON.

9. A logic circuit as claimed in claim 8 wherein the heterostructure device is a second negative differential resistance device.

10. A logic circuit as claimed in claim 8 wherein the pair of field effect transistors, the negative differential resistance device and the heterostructure device are all formed as a unit on a common substrate.

11. A logic circuit comprising:

a substrate;

a pair of heterostructure field effect transistors formed on the substrate and connected in parallel and including first and second common current terminals constructed to be coupled to a supply potential and a reference potential, respectively, each of the pair of field effect transistors further having a control terminal connected to receive a logic signal thereon;

a negative differential resistance device formed on the substrate and operably coupling one of the supply potential to the first common current terminal and the reference potential to the second common current terminal, the negative differential resistance device having a conductance characteristic such that the negative differential resistance device operates approximately at a peak current when one of the pair of field effect transistors is turned ON and approximately at a valley current when both of the pair of field effect transistors are simultaneously turned ON; and a load resistance coupling the other of the supply potential to the first common current terminal and the reference potential to the second common current terminal.

12. A logic circuit as claimed in claim 11 wherein the negative differential resistance device includes a resonant tunneling diode.

13. A logic circuit as claimed in claim 11 wherein the negative differential resistance device includes an Esaki diode.

14. A logic circuit as claimed in claim 11 wherein each of the pair of field effect transistors includes an enhancement mode heterostructure field effect transistor.

15. A logic circuit as claimed in claim 11 wherein the negative differential resistance device is connected between the first common current terminal and a terminal constructed to have applied thereto a supply potential and the logic circuit performs an exclusive OR function.

16. A logic circuit as claimed in claim 11 wherein the negative differential resistance device is connected between the second common current terminal and a terminal constructed to have applied thereto a reference potential and the logic circuit performs an exclusive NOR function.

17. A logic circuit as claimed in claim 11 wherein the load resistance includes a heterostructure device constructed to operate as a resistance when one and both of the pair of field effect transistors are turned ON and the heterostructure device is formed on the substrate.

18. A logic circuit as claimed in claim 17 wherein the heterostructure device is a second negative differential resistance device.

* * * * *